(12) United States Patent
Bryce et al.

(10) Patent No.: US 9,419,203 B2
(45) Date of Patent: Aug. 16, 2016

(54) PASSIVATION AND ALIGNMENT OF PIEZOELECTRONIC TRANSISTOR PIEZORESISTOR

(71) Applicant: International Business Machines Corporation, Armonk, NY (US)

(72) Inventors: Brian A. Bryce, Chevy Chase, MD (US); Josephine B. Chang, Mahopac, NY (US); Matthew W. Copel, Yorktown Heights, NY (US); Marcelo A. Kuroda, Auburn, AL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/747,223

(22) Filed: Jun. 23, 2015

(65) Prior Publication Data

US 2016/0126446 A1 May 5, 2016

Related U.S. Application Data

(63) Continuation of application No. 14/529,929, filed on Oct. 31, 2014, now Pat. No. 9,293,687.

(51) Int. Cl.
 *H01L 29/84* (2006.01)
 *H01L 41/083* (2006.01)
 *H01L 41/047* (2006.01)

(52) U.S. Cl.
 CPC .......... *H01L 41/083* (2013.01); *H01L 41/0477* (2013.01)

(58) Field of Classification Search
 CPC .......................... H01L 41/083; H01L 41/0477
 See application file for complete search history.

(56) References Cited

U.S. PATENT DOCUMENTS

| | | | |
|---|---|---|---|
| 7,848,135 B2 | 12/2010 | Elmegreen et al. |
| 8,159,854 B2 | 4/2012 | Elmegreen et al. |
| 8,247,947 B2 | 8/2012 | Elmegreen et al. |
| 8,405,279 B2 | 3/2013 | Elmegreen et al. |
| 2013/0009668 A1 | 1/2013 | Elmegreen et al. |
| 2014/0169078 A1 | 6/2014 | Elmegreen et al. |

OTHER PUBLICATIONS

List of IBM Patents or Patent Applications Treated as Related; (Appendix P), Filed Apr. 20, 2016; 2 pages.

(Continued)

*Primary Examiner* — Marc Armand
*Assistant Examiner* — Sarah Salerno
(74) *Attorney, Agent, or Firm* — Cantor Colburn LLP; Vazken Alexanian

(57) ABSTRACT

A method of forming a piezoelectronic transistor (PET) device, the PET device, and a semiconductor including the PET device are described. The method includes forming a first metal layer, forming a layer of a piezoelectric (PE) element on the first metal layer, and forming a second metal layer on the PE element. The method also includes forming a well above the second metal layer, forming a piezoresistive (PR) material in the well and above the well, and forming a passivation layer and a top metal layer above the PR material at the diameter of the PR material above the well, wherein a cross sectional shape of the well, the PR material above the well, the passivation layer, and the top metal layer is a T-shaped structure. The method further includes forming a metal clamp layer as a top layer of the PET device.

12 Claims, 13 Drawing Sheets

(56) References Cited

OTHER PUBLICATIONS

Bruce G. Elmegreen et al., "Low Voltage Transistor and Logic Devices With Multiple, Stacked Piezoelectronic Layers", U.S. Appl. No. 15/131,484, filed Apr. 18, 2016.

List of IBM Patents or Patent Applications Treated as Related; (Appendix P), Filed Jul. 9, 2015; 2 pages.

Brian A. Bryce et al., "Passivation and Alignment of Piezoelectronic Transistor Piezoresistor", U.S. Appl. No. 14/529,929, filed Oct. 31, 2014.

Brian A. Bryce et al., "Piezoelectronic Transistor With Co-Planar Common and Gate Electrodes", U.S. Appl. No. 14/529,834, filed Oct. 31, 2014.

Brian A. Bryce et al., "Piezoelectronic Transistor With Co-Planar Common and Gate Electrodes" U.S. Appl. No. 14/747,137, filed Jun. 23, 2015.

Brian A. Bryce et al., "Integrating a Piezoresistive Element in a Piezoelectronic Transistor", U.S. Appl. No. 14/529,886, filed Oct. 31, 2014.

Brian A. Bryce et al., "Integrating a Piezoresistive Element in a Piezoelectronic Transistor" U.S. Appl. No. 14/747,194, filed Jun. 23, 2015.

Bruce G. Elmegreen et al., "Non-Volatile, Piezoelectronic Memory Based on Piezoresistive Strain Produced by Piezoelectric Remanence", U.S. Appl. No. 14/222,813, filed Mar. 24, 2014.

Bruce G. Elmegreen et al., "Low Voltage Transistor and Logic Devices With Multiple, Stacked Piezoelectronic Layers", U.S. Appl. No. 14/468,822, filed Aug. 26, 2014.

Matthew W. Copel et al., "Piezoelectronic Switch Device for RF Applications", U.S. Appl. No. 14/529,380, filed Oct. 31, 2014.

Matthew W. Copel, et al., "Piezoelectronic Switch Device for RF Applications", U.S. Appl. No. 14/745,521, filed Jun. 22, 2015.

Bruce G. Elmegreen et al., "Piezoelectronic Device With Novel Force Amplification", U.S. Appl. No. 14/577,279, filed Dec. 19, 2014.

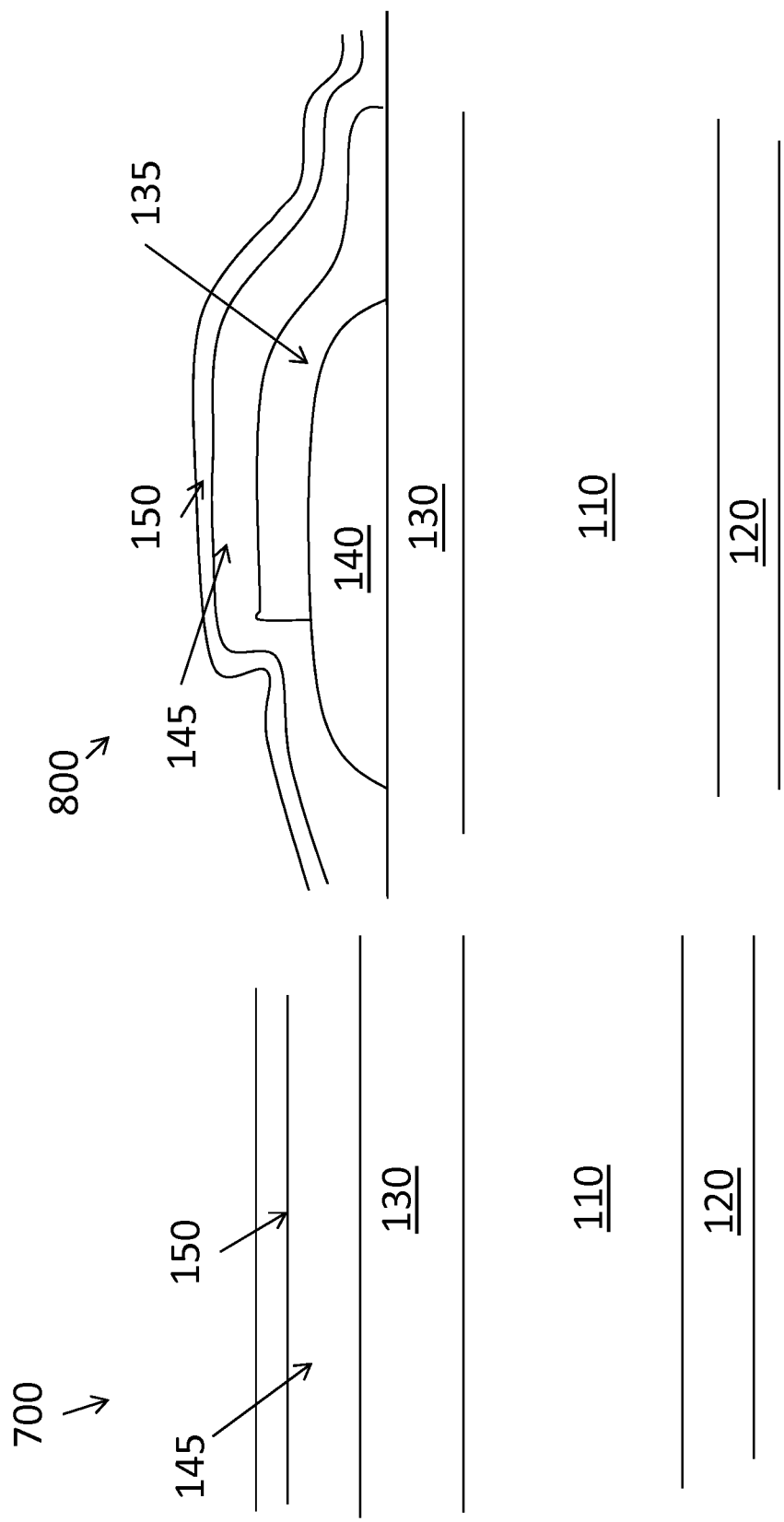

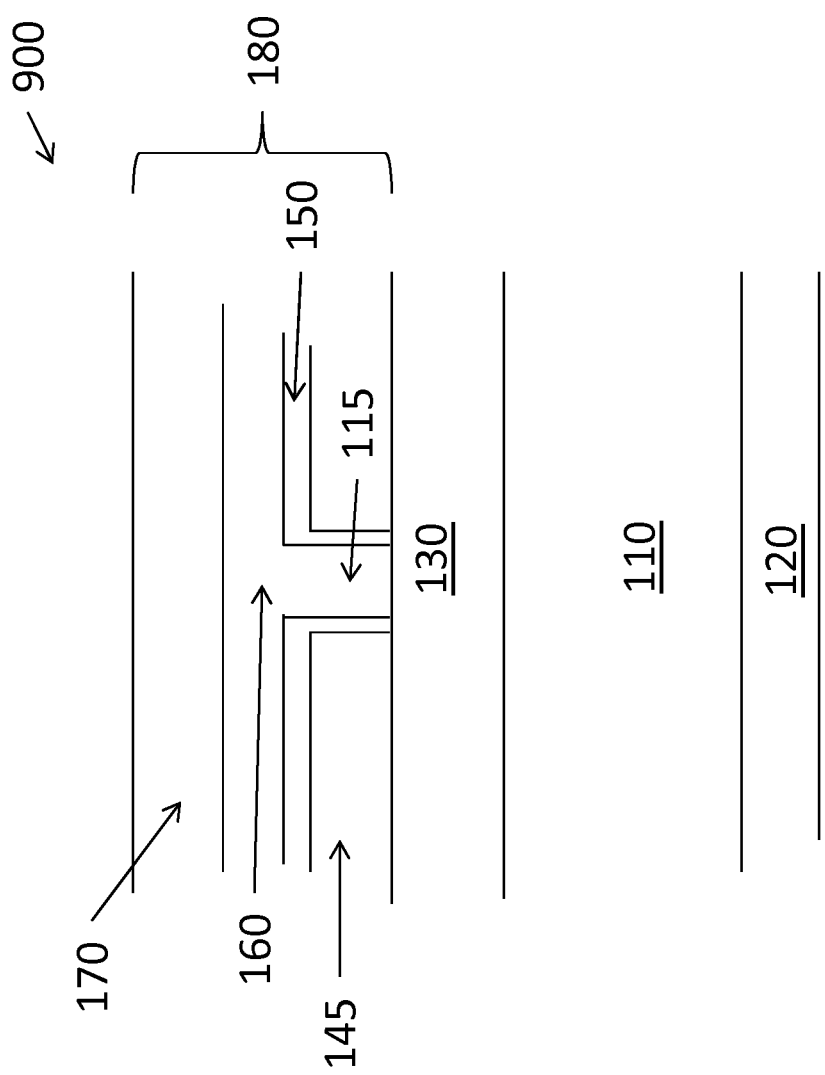

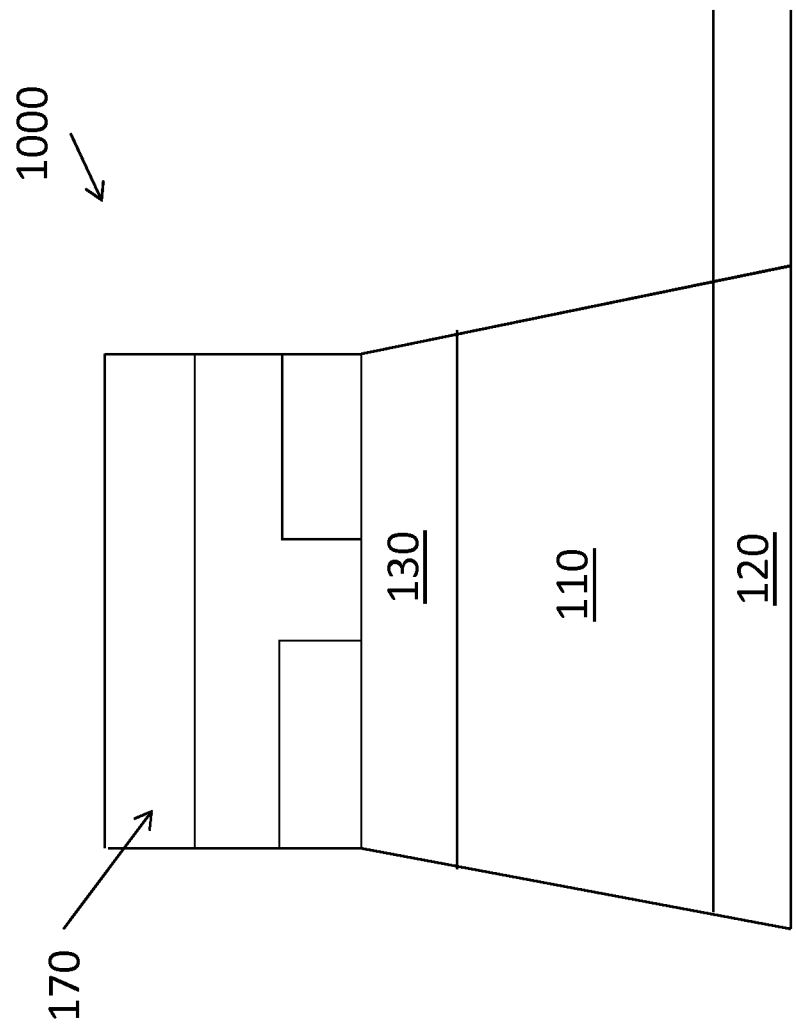

PASSIVATION AND ALIGNMENT OF PIEZOELECTRONIC TRANSISTOR PIEZORESISTOR

This application is a continuation of U.S. application Ser. No. 14/529,929 filed Oct. 31, 2014, the disclosure of which is incorporated by reference herein in its entirety.

STATEMENT OF FEDERAL SUPPORT

This invention was made with Government support under contract number N66001-11-C-4109 awarded by Defense Advanced Research Projects Agency (DARPA). The Government has certain rights in the invention.

BACKGROUND

The present invention relates to a piezoelectronic transistor, and more specifically, to passivation and alignment of a piezoelectronic transistor piezoresistor.

Generally, a piezoelectronic transistor (PET) device is one that can be controlled to change resistivity states such that the PET device may be used as a switch or memory device, for example. Voltage applied across a piezoelectric (PE) element causes displacement of the PE element. The PET device is arranged such that the displacement of the PE element causes the desired modulation of the resistance of a piezoresistive (PR) element. In the fabrication of a PET device, the PR element poses some challenges because the material itself must be handled carefully and must be arranged such that the PET device functions as expected.

SUMMARY

According to one embodiment of the present invention, a method of forming a piezoelectronic transistor (PET) device includes forming a first metal layer; forming a layer of a piezoelectric (PE) element on the first metal layer; forming a second metal layer on the PE element; forming a well above the second metal layer, sides of the well being lined with a passivation film; forming a piezoresistive (PR) material in the well and above the well, a diameter of the PR material above the well being greater than a diameter of the well; forming a passivation layer and a top metal layer above the PR material at the diameter of the PR material above the well, wherein a cross sectional shape of the well, the PR material above the well, the passivation layer, and the top metal layer is a T-shaped structure; and forming a metal clamp layer as a top layer of the PET device.

According to another embodiment, a piezoelectronic transistor (PET) device includes a first metal layer; a layer of piezoelectric (PE) element formed on the first metal layer; a second metal layer on the PE element; piezoresistive (PR) material formed in a well above the second metal layer and above the well, sides of the well being lined with a passivation film and a diameter of the PR material formed above the well being greater than a diameter of the well; a passivation layer and a top metal layer formed above the PR material at the diameter of the PR material above the well, a cross sectional shape of the well, the PR material above the well, the passivation layer, and the top metal layer being a T-shaped structure; and a metal clamp layer as a top layer of the PET device.

According to yet another embodiment, a semiconductor device includes a piezoelectronic transistor (PET) device including a first metal layer; a layer of piezoelectric (PE) element formed on the first metal layer; a second metal layer on the PE element; piezoresistive (PR) material formed in a well above the second metal layer and above the well, sides of the well being lined with a passivation film and a diameter of the PR material formed above the well being greater than a diameter of the well; a passivation layer and a top metal layer formed above the PR material at the diameter of the PR material above the well, a cross sectional shape of the well, the PR material above the well, the passivation layer, and the top metal layer being a T-shaped structure; and a metal clamp layer as a top layer of the PET device; and a voltage source configured to apply a voltage between the first metal layer and the second metal layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 7 is a cross sectional view of another stage in the fabrication of the PET device according to an embodiment of the invention;

FIG. 8 is a cross sectional view of another stage in the fabrication of the PET device according to an embodiment of the invention;

FIG. 9 is a cross sectional view of another stage in the fabrication of the PET device according to an embodiment of the invention;

FIG. 10 is a cross sectional view of another stage in the fabrication of the PET device according to an embodiment of the invention;

DETAILED DESCRIPTION

As noted above, the PR element of a PET device poses challenges. The PR element may be unstable in the presence of oxygen, water vapor, or other materials typically present in the atmosphere, and should be passivated for long term stability of the PET device. The pressure placed on the PR element by displacement of the PE element must be below the yield strength of the clamp that maintains the overall dimensions of the PET device. The PR element must be aligned to add contacts and must be patterned without damaging the material at scale, but patterning the PR element following the passivation process proves problematic. Embodiments of the devices and methods detailed herein relate to achieving both the requisite passivation and alignment for the PR element of the PET device.

Figure 1:
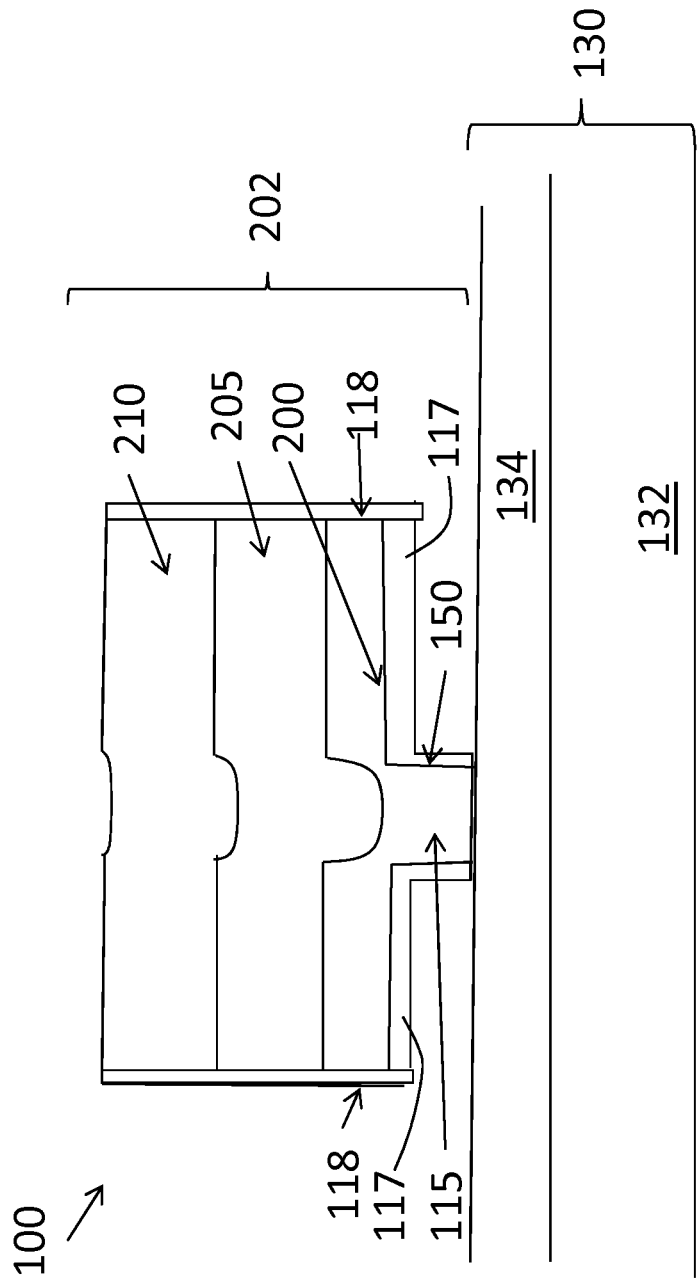
FIG. 1 is a cross sectional view of aspects of a PET device according to an embodiment of the invention.

FIG. 1 is a cross sectional view of aspects of a PET device 100 according to an embodiment of the invention. The PE element 110 (FIG. 3) is not shown in FIG. 1. A well 115 for deposition of the PR element 200 is detailed. A bottom contact is comprised of layers of a transition metal 132 such as ruthenium (Ru), and a conductive oxygen blocking passivation layer 134 such as titanium nitride (TiN), collectively referred to as metal layer 130. The PE element 110 would be below the Ru or transition metal 132, and the metal layer 130 (bottom contact for the PR element 200) is the top electrode of the PE element 110. The well 115 above the bottom contact is lined with a passivation layer 150 such as atomic layer deposited (ALD) hafnium oxide ($HfO_2$) or silicon dioxide ($SiO_2$). The well 115 may instead be passivated by aluminum oxide ($Al_2O_3$), or silicon nitride ($Si_3N_4$). The passivation layer 150 protects the PR element 200, which may be samarium (Sm) or thulium (Tm) based monochalcogenide, for example. Exemplary PR elements 200 include samarium selenide (SmSe), samarium monosulfide (SmS), samarium telluride (SmTe), thulium telluride (TmTe), thulium monosulfide (TmS), and thulium selenide (TmSe). The well 115 diameter may be on the order of 50 nanometers (nm), for example. More than one well 115 may be formed for the deposition of the PR element 200. The well 115 is passivated at the sidewall of the well 115 and is additionally be passivated along the edges 117 of the PR element 200 layer to the well 115.

The pressure modulated region is the well 115 in contact with the conductive passivation layer 134 (TiN). That is, the active portion of the PR element 200, the portion that is modulated by displacement of the PE element 110 (FIG. 3), is not patterned or processed. Thus, the passivated well 115 structure acts to protect the active portion of the PR element 200 (the portion of the PR element 200 that is in the well 115. The wider portion of the PR element 200 (the portion above the well 115) aids in alignment of the PR element 200 with the top metal layers. These top metal layers disposed above the PR element 110 include another conductive passivation layer of TiN 205 and metal Ru 210, the same materials as the bottom contact. The relatively large diameter (as compared with the well 115, for example) of the stress spreading top metal layers enables alignment of additional layers to the PET device 100 structure, and keeps the stress in the structure below the yield strength of the materials used. The structure formed by the well 115 and layers 200, 205, 210 is collectively referred to as the T-shaped structure 202. A sidewall 118 at the edge of the T-shaped structure 202 may optionally be any metal or insulating thin film that blocks oxygen (e.g., TiN).

Figure 2:
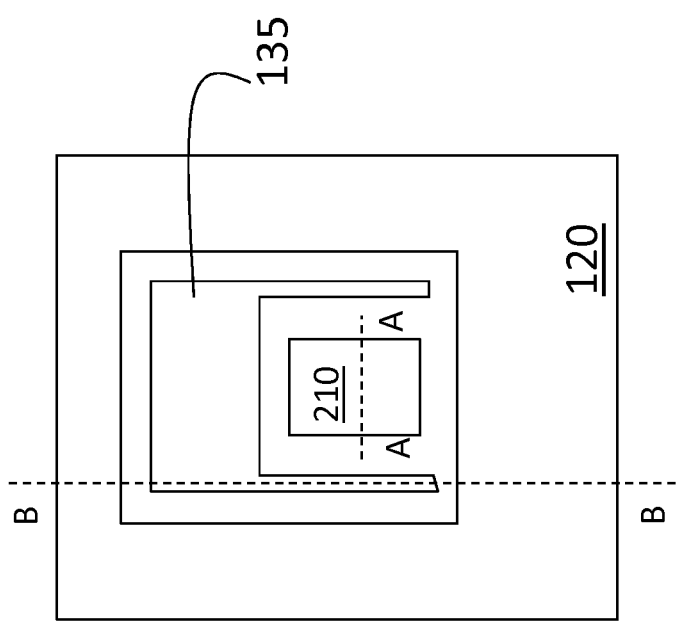
FIG. 2 is a top view of a PET device without the metal clamp layer according to an embodiment of the invention.
Figure 3:
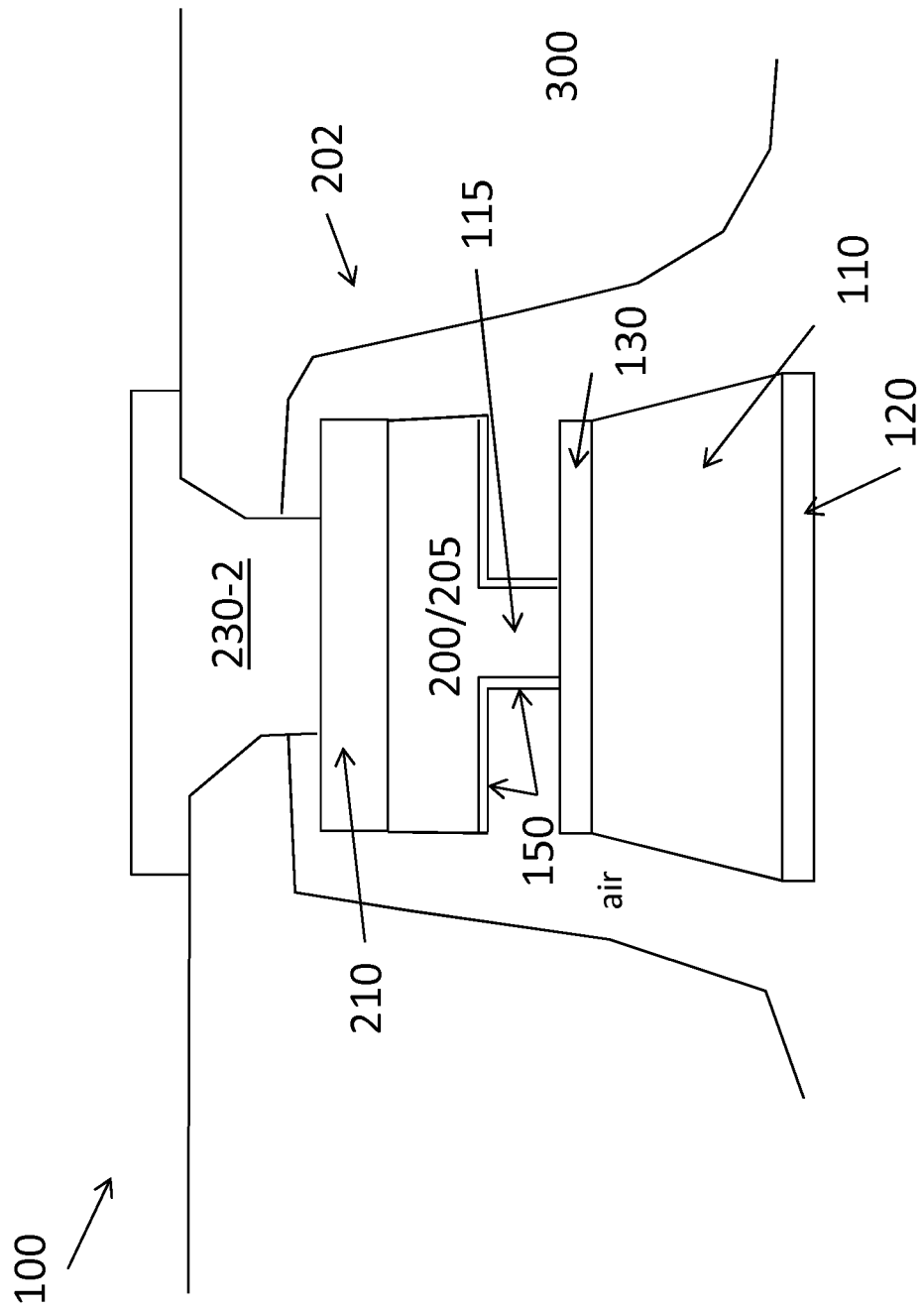
FIG. 3 is a cross sectional view of the PET device shown in FIG. 2 along A-A.
Figure 4:
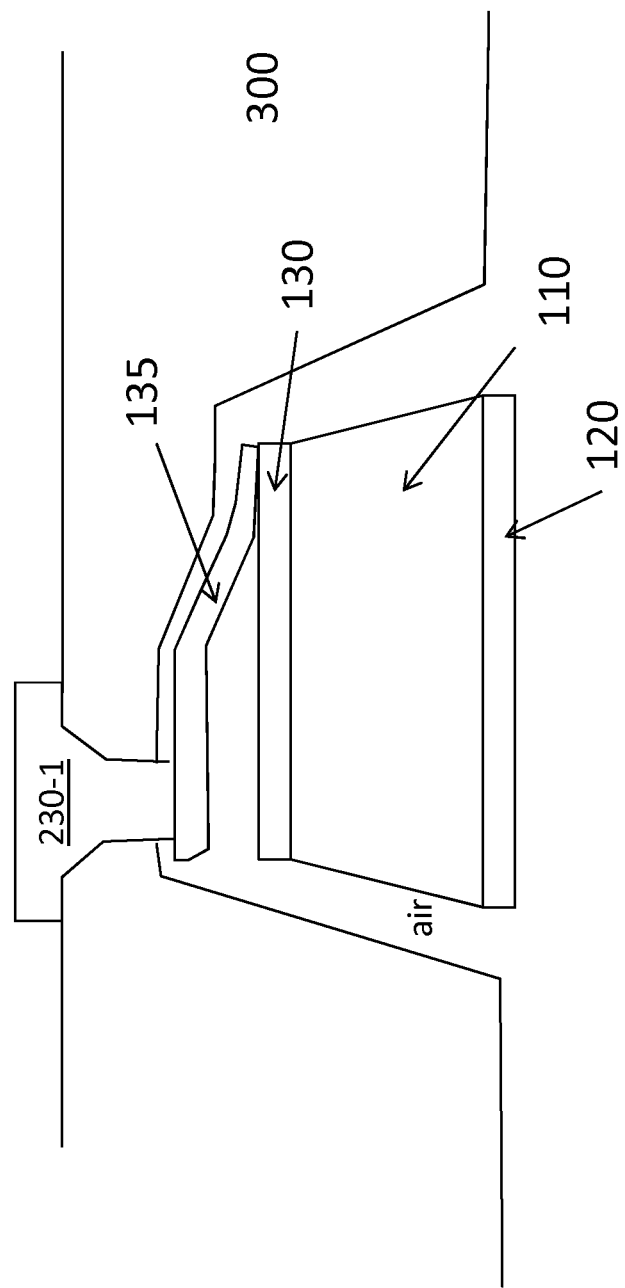
FIG. 4 is a cross-sectional view of the PET device shown in FIG. 2 along B-B.

FIG. 2 is a top view of a PET device 100 without the metal clamp layer 230 (FIG. 3) according to an embodiment of the invention. A metal layer 120 below the PE element 110 is shown. A spring 135 formed from a metal is also shown and is detailed below with reference to FIG. 4. The layer of Ru 210 is also shown. A cross sectional view across the Ru 210 is shown in FIG. 3, and a cross sectional view along the spring 135 is shown in FIG. 4. Exposed metals (e.g., the TiN 205 and Ru 210 layers) may be capped in materials that are resistant to xenon difluoride ($XeF_2$) etching or they must be resistant themselves. Exemplary caps are $HfO_2$ and $Al_2O_3$. In addition, TiN 205 and Ru 210 may instead be Ru/titanium aluminum nitride (TiAN)/platinum (Pt), ruthenium oxide ($RuO_2$)/TiN/palladium (Pd), iridium oxide, or ($IrO_2$)/Pt.

FIG. 3 is a cross sectional view of the PET device 100 shown in FIG. 2 along A-A. FIG. 3 shows the PE element 110 between the metal layer 120 and the metal layer 130. Application of a voltage between the two metal layers 120, 130 causes displacement of the PE element 110 which in turn causes modulation of the PR element 200. The T-shaped structure 202 including the well 115 is shown above the metal layer 130. Above the T-shaped structure 202, a metal clamp layer 230 (a portion of the metal clamp layer 230-2 associated with the T-shaped structure 202 is shown) maintains the height of the PET device 100 despite movement of the PE element 110. That is, the displacement of the PE element 110 coupled with the rigidity of the metal clamp layer 230 causes the compression of the PR element 200 resulting in modulation of its conductivity. As indicated in the figure, $SiO_2$ 300 surrounds the active elements of the PET device 100.

Figure 13:
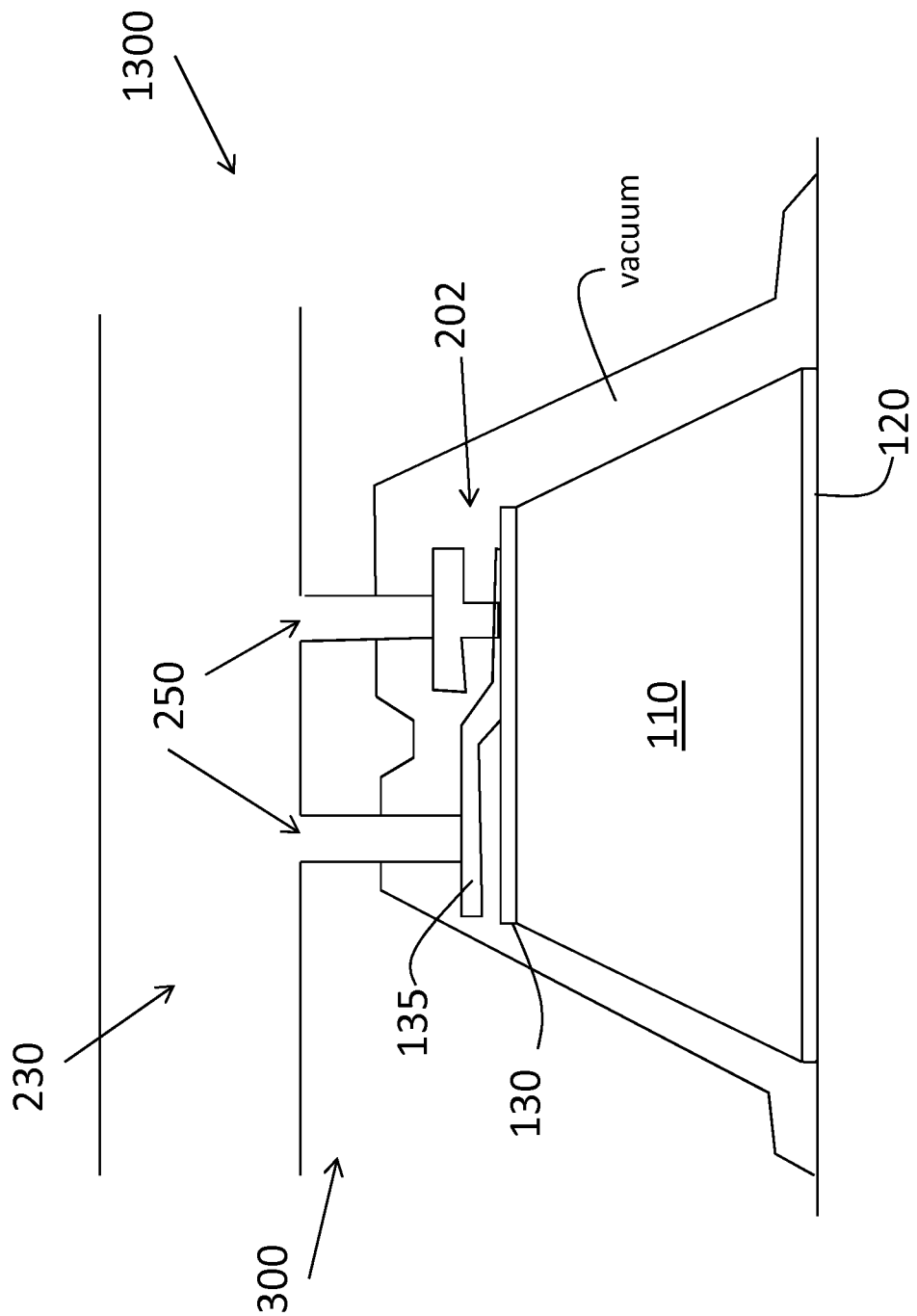
FIG. 13 is a cross-sectional view of a stage in the formation of the PET device according to an embodiment of the invention.

FIG. 4 is a cross-sectional view of the PET device 100 shown in FIG. 2 along B-B. The spring 135 is shown above the stack of the metal layer 120, PE element 110, and metal layer 130. A portion metal clamp layer 230-1 is shown above the spring 135. As shown in FIG. 13, the metal clamp layer 230 (which becomes divided into portions 230-1 and 230-2 shown in FIGS. 3 and 4) seals the vias 250 and provides electrical contact to the T-shaped structure 202 and the spring 135. The portions of the metal clamp layer 230-1 and 230-2 are anchored in place by their adhesion to the insulating portion of the SiO2 300. The clamp is constituted by the oxide layer SiO2 300 and the metal clamp layer 230-1, 230-2. Thus, the purpose of the spring 135 is to ensure the force created by the PE element 110 displacement acts primarily on the PR element 200 in the well 115 (part of the T-shaped structure 202) while creating a conductive metal contact to metal layer 130.

Figure 5:
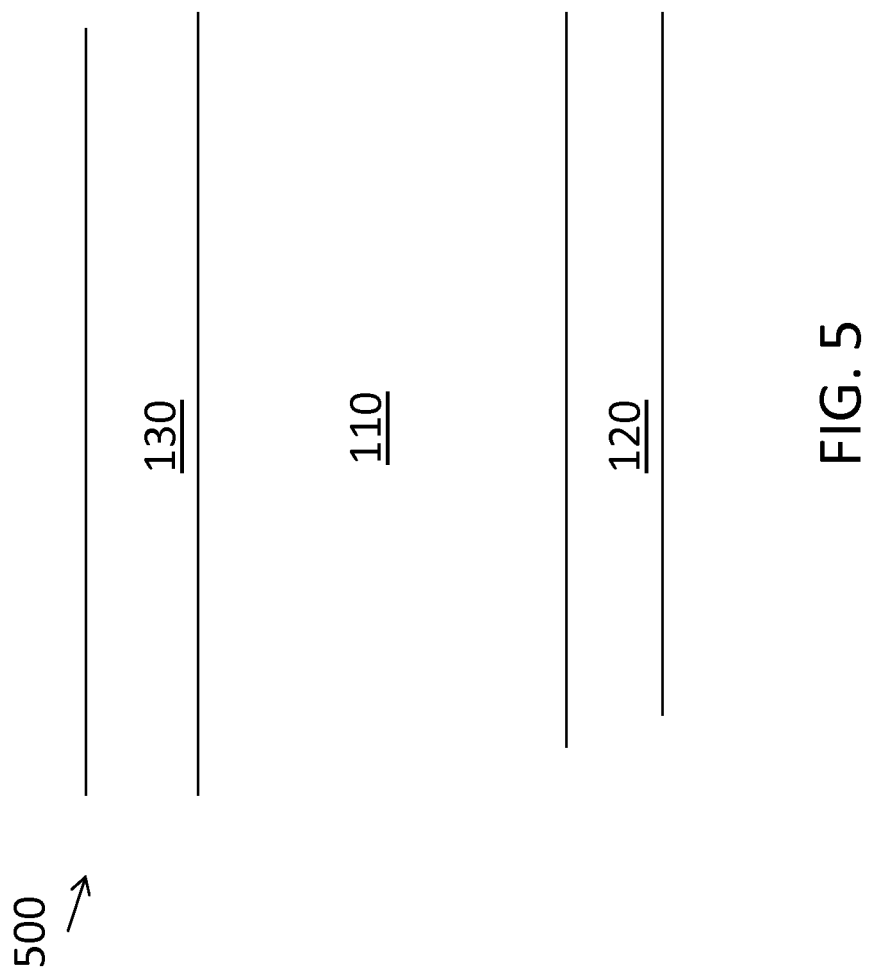
FIG. 5 is a cross sectional view of a stage in the fabrication of the PET device according to an embodiment of the invention.
Figure 6:
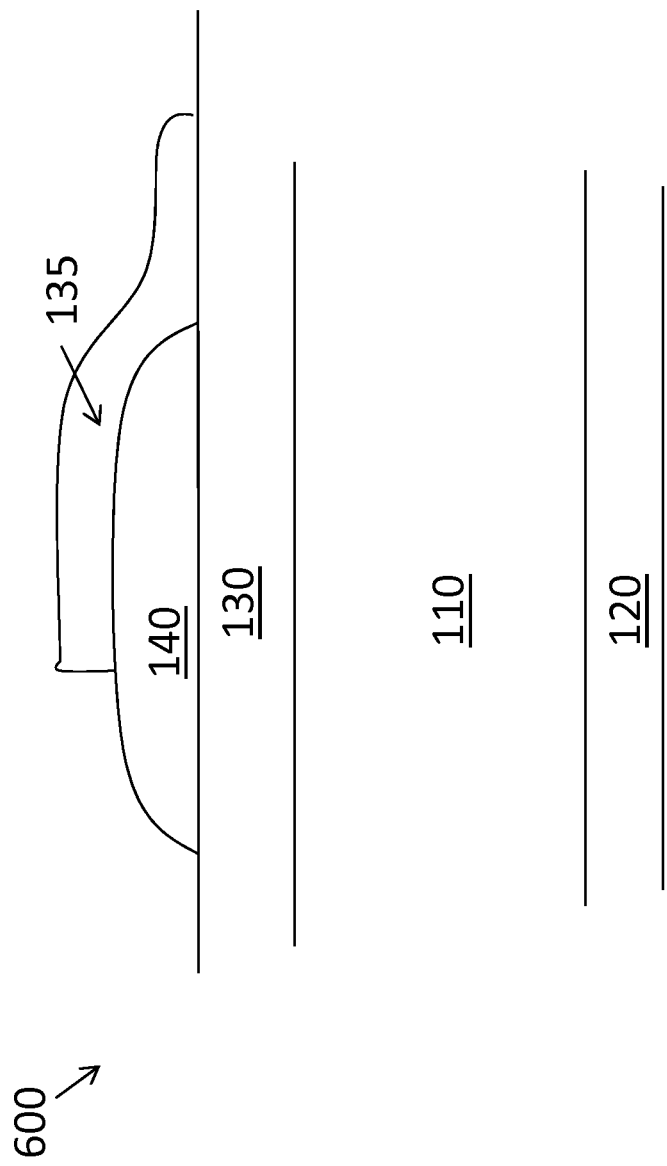
FIG. 6 is a cross sectional view of another stage in the fabrication of the PET device according to an embodiment of the invention.

FIGS. 5 to 12 illustrate stages in the formation of the PET device 100 according to an embodiment of the invention. FIG. 5 is a cross sectional view of a stage 500 in the fabrication of the PET device 100 according to an embodiment of the invention. In the stage 500 shown in FIG. 5, the metal layer 120, the PE element 110, and the metal layer 130 are stacked. Specifically, to form the metal layer 120 according to one embodiment, silicon oxide ($SiO_2$) is grown, titanium (Ti) is deposited and oxidized, and platinum (Pt) is deposited (each of these steps is not illustrated). To form the metal layer 130, Ru (132)/TiN (134) is deposited. FIG. 6 is a cross sectional view of another stage 600 in the fabrication of the PET device 100 according to an embodiment of the invention. Silicon (Si) 140 is deposited on the metal layer 130 and etched via RIE (in combination with photolithography) such that a portion of the metal layer 130 remains covered with the Si 140. The Si 140 is a sacrificial layer that facilitates the formation of the spring 135. Ru/TiN is deposited such that a portion is on the Si 140 and another portion is on the metal layer 130 and is etched via a lithographically defined RIE to define the spring 135.

FIG. 7 is a cross sectional view of another stage 700 in the fabrication of the PET device 100 according to an embodiment of the invention. FIG. 7 shows a portion of the PET device 100 where the well 115 will be formed and where the spring 135 is not formed. Si 145 is deposited over the metal layer 130 and $HfO_2/SiO_2$ 150 is deposited on the Si 145. FIG. 8 is a cross sectional view of another stage 800 in the fabrication of the PET device 100 according to an embodiment of the invention. FIG. 8 shows the portion of the PET device 100 that includes the spring 135. In this portion, Si 145 and $HfO_2$/ $SiO_2$ 150 are deposited over the spring 135. FIG. 9 is a cross sectional view of another stage 900 in the fabrication of the PET device 100 according to an embodiment of the invention. FIGS. 9-12 show the portion of the PET device 100 shown in FIG. 7 (spring is not shown). Electron-beam lithography is used to define the well 115 in combination with RIE or ion milling. As noted above, more than one well 115 may be formed in this manner. The well 115 is etched to the depth of the Si 145 layer via RIE or ion milling to the TiN (134) layer of the metal layer 130. Any remaining resist is then stripped. A coating of $HfO_2$ is added to the sides of the well 115. This sidewall coating is created by applying the $HfO_2$ 150 on all surfaces and then using a blanket highly anisotropic RIE or ion milling step to remove the material from the bottom of the well. Following the coating process, germanium (Ge) 160 is deposited. Lithographically patterned Ni with a Ti adhesion layer 170 is then deposited on top of the Ge 160 layer. Layers 145 through 170 are indicated as 180, a shown in FIG. 9.

Figure 11:
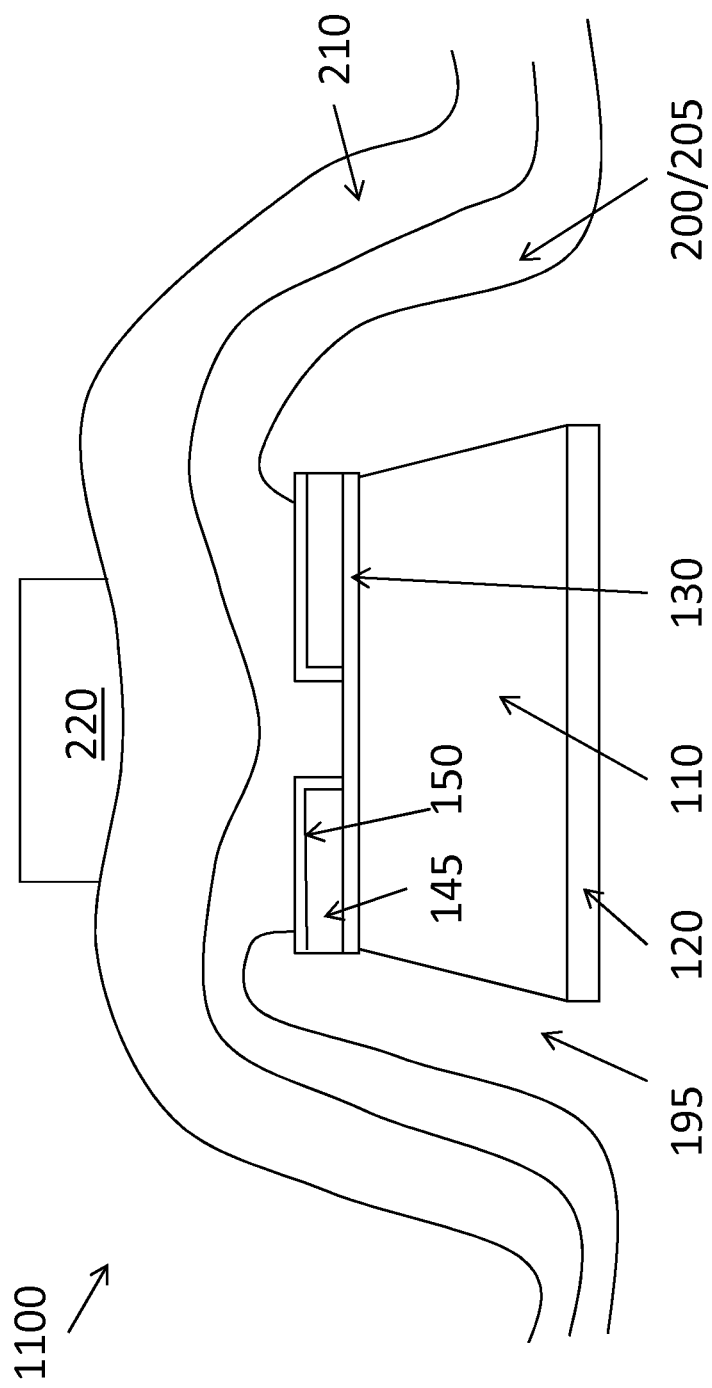
FIG. 11 is a cross sectional view of another stage in the fabrication of the PET device according to an embodiment of the invention.
Figure 12:
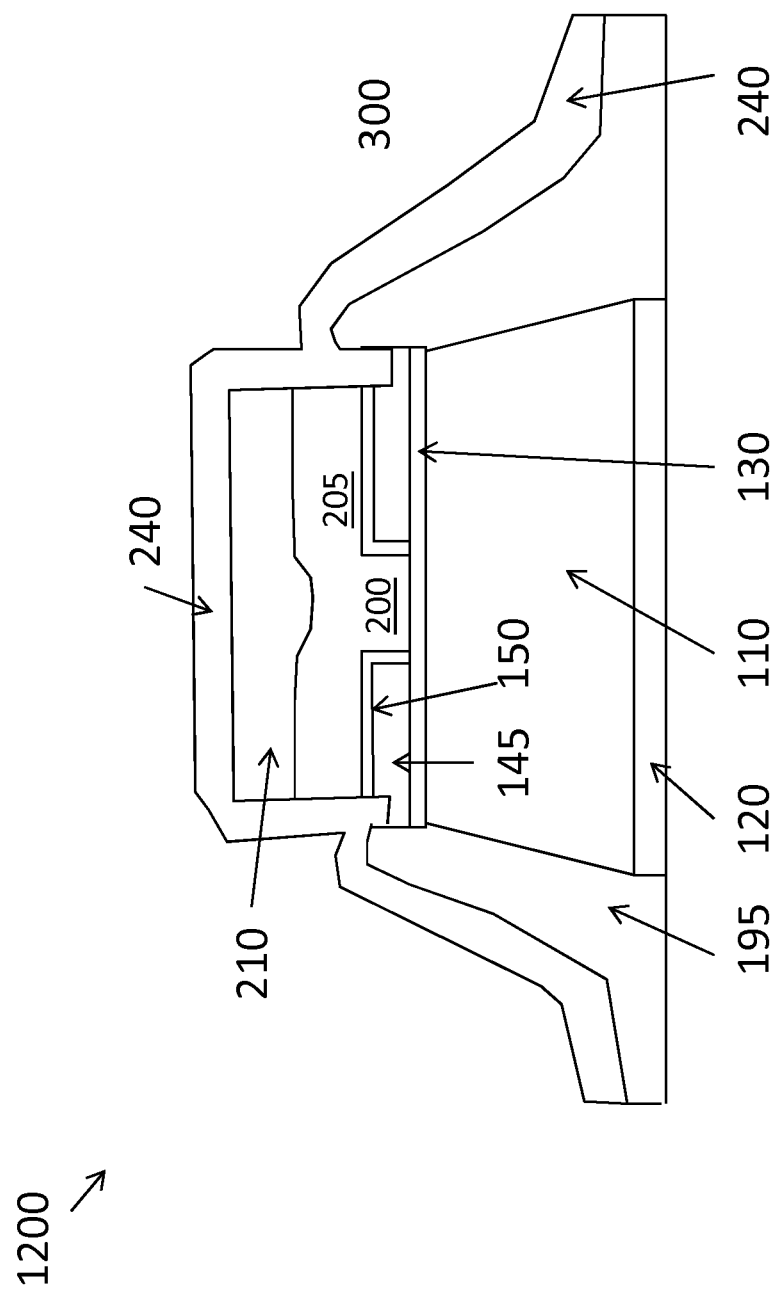
FIG. 12 is a cross sectional view of another stage in the fabrication of the PET device according to an embodiment of the invention.

FIG. 10 is a cross sectional view of another stage 1000 in the fabrication of the PET device 100 according to an embodiment of the invention. The PE element 110 is etched to the metal layer 120 via RIE utilizing the Ni of layer 170 as a hardmask. The metal layer 120 is patterned via RIE in combination with photolithography. After metal layer 120 is patterned the Ti/Ni 170 layer is removed by dissolving Ge 160 in hydrogen peroxide ($H_2O_2$). FIG. 11 is a cross sectional view of another stage 1100 in the fabrication of the PET device 100 according to an embodiment of the invention. Ge 195 is deposited and a window is opened in it using hydrogen peroxide ($H_2O_2$) solution. This window is defined lithographically and is aligned to the area containing the well 115. The PR element 200 and TiN 205 are deposited with a Ru 210 cap, and the layers 200, 205, 210 are etched to the Si 145 layer via RIE with a photoresist 220 above the Ru 210 such that the structure 1200 shown in FIG. 12 is achieved. FIG. 12 is a cross sectional view of another stage 1200 in the fabrication of the PET device 100 according to an embodiment of the invention. A layer of Ge or Si layer 240 is deposited, and $SiO_2$ 300 is then deposited conformally around the stage 1200 structure to a thickness greater than the total height of the PE element 110 and T-shaped structure 202. Chemical mechanical planarization (CMP) is used to polish the film stack flat resulting in a flat layer of $SiO_2$ 300 with the stage 1200 structure embedded below the surface.

FIG. 13 is a cross-sectional view of a stage 1300 in the formation of the PET device 100 according to an embodiment of the invention. FIG. 13 shows both the spring 135 and the T-shaped structure 202 formed on the metal layer 130. After stage 1200 (FIG. 12), photolithography is used to define vias 250 in the $SiO_2$ 300 to provide electrical access to the spring 135 and the T-shaped structure 202. The vias 250 are etched to the Ge or Si layer 240 using RIE. The mask is photoresist. Then XeF2 is applied, which removes the Si 145, Ge 195, and Ge or Si layer 240, leaving air. Metal (the metal clamp layer 230) is deposited (see e.g., FIGS. 3 and 4) into the vias 250 via evaporation without any mask. Deposition of the metal clamp layer 230 hermetically seals the PET device 100 and provides electrical contact to the top of the T-shaped structure 202 (and, thus, to one side of the PR element 200) and to the spring layer 135. In turn the spring provides an electrical connection to layer 130 shared by the PR element 200 and PE element 110. Access to metal layer 120 is provide for outside of the clamping structure. One final lithography step is done to provide a resist mask to etch metal layer 230 into the two parts 230-1 and 230-2 that individually contact the spring 135 and top film of the T structure 210.

Figure 14:
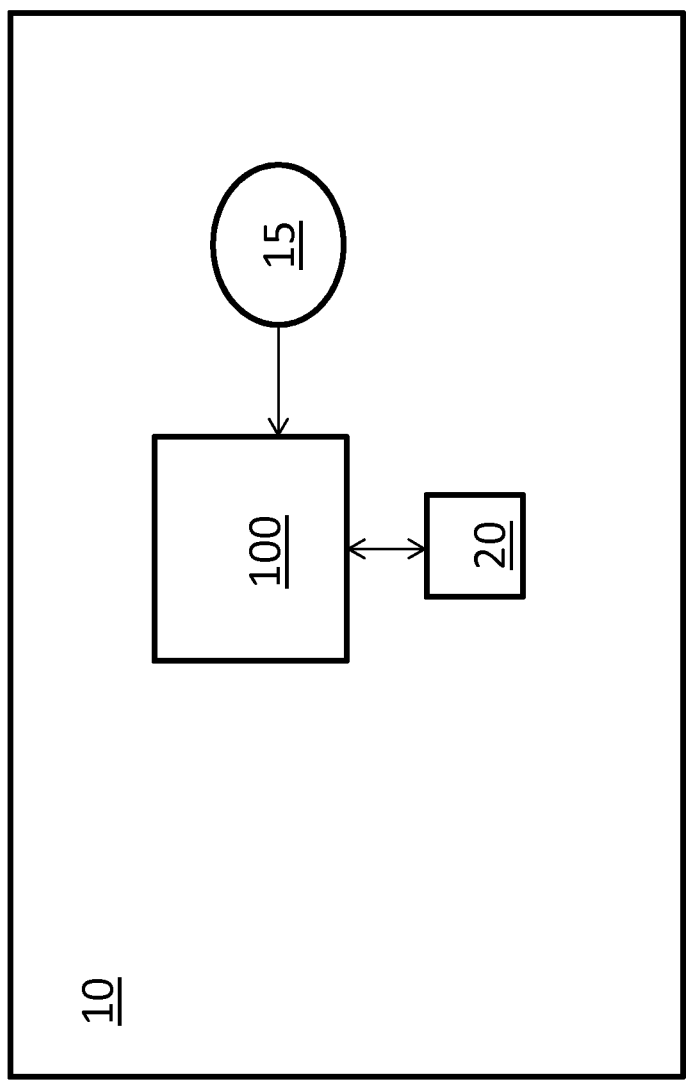
FIG. 14 is a block diagram of aspects of a semiconductor device including a PET device according to an embodiment of the invention.

FIG. 14 is a block diagram of aspects of a semiconductor device 10 including a PET device 100 according to an embodiment of the invention. A voltage source 15 is used to apply a voltage across the metal layer 120 and the metal layer 130 to modulate the PE element 110. This modulation results in switching the resistive state of the PR element 200 between low and high. When the PET device 100 is used as a switch element, read and write components 20 may be coupled to the PET device 100. The PET device 100 may be used as a memory in another context as part of semiconductor device 10, as well.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A piezoelectronic transistor (PET) device, comprising:
a first metal layer;
a layer of piezoelectric (PE) element formed on the first metal layer;
a second metal layer on the PE element;
piezoresistive (PR) material formed in a well above the second metal layer and above the well, sides of the well being lined with a passivation film and a diameter of the PR material formed above the well being greater than a diameter of the well;
a passivation layer and a top metal layer formed above the PR material at the diameter of the PR material above the well, a cross sectional shape of the well, the PR material above the well, the passivation layer, and the top metal layer being a T-shaped structure; and a metal clamp layer as a top layer of the PET device.

2. The PET device according to claim 1, further comprising a spring on the second metal layer adjacent to the T-shaped structure.

3. The PET device according to claim 2, wherein the spring is electrically connected to the metal clamp layer through vias.

4. The PET device according to claim 2, wherein the spring is comprised of ruthenium (Ru) and titanium nitride (TiN).

5. The PET device according to claim 1, wherein the metal clamp layer is aligned with the T-shaped structure to ensure a close contact between the PR material in the well and the second metal layer above the PE element.

6. The PET device according to claim 1, wherein an edge of the T-shaped structure above the well is lined with the passivation film.

7. A semiconductor device, comprising:
a piezoelectronic transistor (PET) device comprising
a first metal layer;
a layer of piezoelectric (PE) element formed on the first metal layer;
a second metal layer on the PE element;
piezoresistive (PR) material formed in a well above the second metal layer and above the well, sides of the well being lined with a passivation film and a diameter of the PR material formed above the well being greater than a diameter of the well;
a passivation layer and a top metal layer formed above the PR material at the diameter of the PR material above the well, a cross sectional shape of the well, the PR material above the well, the passivation layer, and the top metal layer being a T-shaped structure; and
a metal clamp layer as a top layer of the PET device; and
a voltage source configured to apply a voltage between the first metal layer and the second metal layer.

8. The semiconductor device according to claim 7, further comprising a spring on the second metal layer adjacent to the T-shaped structure.

9. The semiconductor device according to claim 8, wherein the spring is electrically connected to the metal clamp layer through vias.

10. The semiconductor device according to claim 8, wherein the spring is comprised of ruthenium (Ru) and titanium nitride (TiN).

11. The semiconductor device according to claim 7, wherein the metal clamp layer is aligned with the T-shaped structure to ensure a close contact between the PR material in the well and the second metal layer above the PE element.

12. The semiconductor device according to claim 7, wherein an edge of the T-shaped structure above the well is lined with the passivation film.

* * * * *